(12) United States Patent
Lee et al.

(10) Patent No.: US 6,825,494 B2
(45) Date of Patent: *Nov. 30, 2004

(54) POLYCRYSTALLINE SILICON THIN FILM USED IN A THIN FILM TRANSISTOR AND A DEVICE USING THE SAME

(75) Inventors: Ki Yong Lee, Suwon (KR); Ji Yong Park, Suwon (KR); Woo Young So, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/454,612

(22) Filed: Jun. 5, 2003

(65) Prior Publication Data
US 2004/0004219 A1 Jan. 8, 2004

(30) Foreign Application Priority Data
Jul. 8, 2002 (KR) .................................. 10-2002-0039495

(51) Int. Cl.[7] .................................. H01L 31/036
(52) U.S. Cl. .................................. 257/64; 257/66
(58) Field of Search .................... 257/66, 72, 347, 257/64

(56) References Cited

U.S. PATENT DOCUMENTS 6,177,391 B1    1/2001   Zafar

2003/0102508 A1 *  6/2003  Lee ........................... 257/359
2003/0141503 A1 *  7/2003  Lee ........................... 257/64

FOREIGN PATENT DOCUMENTS

WO   WO 97/45827   12/1997

* cited by examiner

*Primary Examiner*—Eddie Lee
*Assistant Examiner*—Douglas W. Owens
(74) *Attorney, Agent, or Firm*—Staas & Halsey LLP

(57) ABSTRACT

A polycrystalline silicon thin film of a TFT in which probabilities P1 and P2 for which the maximum number of respective primary crystal grain boundaries for transistors TR1 and TR2 arranged perpendicular to each other are contained in active channel regions are P1=(D1−(Nmax1−1)*Gs1)/Gs1 and P2=(D2−(Nmax2−1)*Gs2)/Gs2: where P1 or P2 is not 0.5, D1=L1 cos θ, W1 sin θ, D2=L2 cosθ+W2 sin θ, L1 and L2 are lengths of active channels, and W1 and W2 are widths of the active channels, of the transistors TR1 and TR2, Nmax1 and Nmax2 are the maximum numbers of the primary crystal grain boundaries contained in the active channel regions for each of TR1 and TR2, Gs1 and Gs2 are crystal grain sizes having a fatal effect on characteristics of each of TR1 and TR2, and θ is an angle in which the primary crystal grain boundaries are inclined perpendicular to an active channel direction of the respective transistors TR1 and TR2.

16 Claims, 12 Drawing Sheets

POLYCRYSTALLINE SILICON THIN FILM USED IN A THIN FILM TRANSISTOR AND A DEVICE USING THE SAME

CROSS-REFERENCE TO RELATED APPLICATIONS

This application claims the benefit of Korean Application No. 2002-39495, filed Jul. 8, 2002, in the Korean Intellectual Property Office.

BACKGROUND OF THE INVENTION

1. Field of the Invention

The present invention relates to a polycrystalline silicon thin film used in a thin film transistor and a device using the same, and more particularly, to a polycrystalline silicon thin film used in a thin film transistor with silicon grains in a crystal growing direction which is constant and regularized, and a device using a thin film transistor fabricated using the above described polycrystalline silicon thin film.

2. Description of the Related Art

Bonding defects such as atom dangling bonds existing on crystal grain boundaries of polycrystalline silicon included in active channel regions are known to act as traps on electric charge carriers when fabricating a thin film transistor (hereinafter referred to as TFT) using polycrystalline silicon.

Therefore, size, size uniformity, number and position, and direction of crystal grains not only directly or indirectly exert a fatal influence on TFT characteristics such as threshold voltage (Vth), subthreshold slope, charge carrier mobility, leakage current and device stability, but also exert a fatal influence on uniformity of TFTs depending on the position of the crystal grains when fabricating an active matrix display substrate using TFTs.

The number of fatal crystal grain boundaries (hereinafter referred to as "primary" crystal grain boundaries) included in active channel regions of a TFT on the whole substrate of a display device can be equal to or different from each other depending on the size of the crystal grains, the inclination angle θ, the dimension of active channels (length (L) and width (W)) and the position of each TFT on the substrate, as illustrated in FIG. 1A and FIG. 1B.

As illustrated in FIG. 1A and FIG. 1B, characteristics of each TFT in a TFT substrate comprising two or more TFTs (type 1 transistor (TR1) and type 2 transistor (TR2)) having a source/drain direction which is perpendicular to each other have different effects of crystal grain boundaries depending on a degree at which the crystal grain boundaries are perpendicular to the source/drain direction or a degree of inclination to a normal line perpendicular to the source/drain direction, wherein crystal grain boundaries having a fatal influence on characteristics of two shaped TFTs, which are perpendicular to each other, are approximately perpendicular. That is, the size of crystal grains having a fatal influence on TFT characteristics in the type 1 transistor (TR1) becomes Gs1 while the size of crystal grains having fatal influence on TFT characteristics in the type 2 transistor (TR2) becomes Gs2.

The number of crystal grain boundaries included in active channel regions of each TFT can be varied depending on the size and direction of crystal the grains, and the TFT dimensions. For example, three fatal crystal grain boundaries exist in a type 1 transistor (TR1), and two crystal grain boundaries exist in a type 2 transistor (TR2) in FIG. 1A, while three crystal grain boundaries can be contained in a type 1 transistor (TR1), and two crystal grain boundaries can be contained in a type 2 transistor (TR2) for the equal crystal grain boundaries and TFT dimensions. Therefore, uniformity of characteristics between TFTs is greatly influenced.

Polycrystalline or single crystalline particles can form large silicon grains on a substrate using sequential lateral solidification (SLS) crystallization technology, as illustrated in FIG. 2A and FIG. 2B. It is reported that a TFT fabricated using the large silicon grains can obtain similar characteristics to that of a TFT fabricated using single crystalline silicon.

However, numerous TFTs used in drivers and pixel arrays should be fabricated in order to fabricate an active matrix display.

For example, approximately a million pixels are required in fabricating an active matrix display having super video graphics array (SVGA) resolution, one TFT is required in each pixel in the case of liquid crystal displays (LCD), and two or more TFTs in each pixel are required in a display using an organic light emitting substance, e.g., an organic electroluminescent device.

Therefore, it is impossible to fabricate TFTs by growing a certain number of crystal grains only in one to two million or more active channel regions of each TFT in a certain direction.

In order to supplement these problems, it is disclosed in PCT International Patent No. WO 97/45827 that the amorphous silicon on the whole substrate is converted into polycrystalline silicon, or only selected regions on the substrate are crystallized using SLS technology after depositing amorphous silicon by plasma enhanced chemical vapor deposition (PECVD), low pressure chemical vapor deposition (LPCVD) or sputtering (FIG. 2A and FIG. 2B).

The selected regions are also considerably wide regions compared with active channel regions having dimensions of several μm×several μm. Furthermore, the size of a laser beam used in SLS technology is approximately several μm×several μm so that stepping and shifting of the laser beam or the stage of the laser beam are inevitably required to crystallize amorphous silicon of the whole regions or selected regions on a substrate, wherein misalignment exists between regions on which a laser beam is irradiated. Therefore, the number of "primary" crystal grain boundaries included in numerous active channel regions of a TFT is varied, and the TFT on the whole substrate, in driver regions or in pixel cell regions has unpredictable non-uniformity. The non-uniformity can exert a fatal bad influence on the realization of an active matrix display device.

Furthermore, it is disclosed in U.S. Pat. No. 6,177,391 that a barrier effect of the crystal grain boundaries for the direction of electric charge carriers is minimized (FIG. 3A), and TFT characteristics being second to single crystalline silicon is obtained accordingly in the case where the direction of active channels is parallel to the direction of crystal grains grown by the SLS crystallization method when fabricating a TFT for an LCD comprising a driver and a pixel array by forming large silicon grains using an SLS crystallization technology while a lot of the crystal grain boundaries in which the TFT characteristics act as a trap for the electric charge carriers exist, and the TFT characteristics are greatly deteriorated in the case where the active channel direction is perpendicular to the crystal grain growing direction (FIG. 3B).

There are cases where a TFT inside the driver circuit and a TFT inside pixel cell regions usually have an angle of 90° when actually fabricating an active matrix display, wherein uniformity of the device can be improved by fabricating the active matrix display in such a way that a direction of the active channel region is inclined at a growing angle of the crystal grains by 30 to 60° to improve uniformity of characteristics between TFTs while not greatly deteriorating the characteristics of each TFT, as illustrated in FIG. 3C.

However, there is the probability that fatal crystal grain boundaries are included in the active channel regions as the method also uses crystal grains of a limited size formed by the SLS crystallization technology. Accordingly, the method has problems in that unpredictable non-uniformity causing differences of characteristics between TFTs exist.

SUMMARY OF THE INVENTION

Accordingly, it is an object of the present invention to provide a polycrystalline silicon thin film comprising TFTs that are perpendicular to each other to be capable of determining optimum process conditions on the size and the direction of silicon crystal grains and optimum dimensions of active channels to secure TFT characteristics and uniformity required when fabricating a TFT substrate and an active display device by inducing a numerical expression capable of calculating probability in which the maximum number of "primary" crystal grain boundaries in active channel regions discriminating uniformity of the TFT characteristics during fabrication of the TFT substrate is included, and a device using an active matrix TFT fabricated using the polycrystalline silicon thin film.

Additional aspects and advantages of the invention will be set forth in part in the description which follows and, in part, will be obvious from the description, or may be learned by practice of the invention.

The foregoing and/or other aspects of the present invention are achieved by providing a polycrystalline silicon thin film of a TFT characterized in that probabilities P1 and P2, in which the maximum number of respective primary crystal grain boundaries for transistors TR1 and TR2 that are arranged perpendicularly to each other can be contained in active channel regions, are represented as in the following Expressions 1 and 2, and P1 or P2 is not 0.5:

$P1=(D1-(N\max1-1)\times Gs1)/Gs1$  Expression 1

$P2=(D2-(N\max2-1)\times Gs2)/Gs2$  Expression 2 where $D1=L1 \cos \theta + W1 \sin \theta$, $D2=L2 \cos \theta + W2 \sin \theta$, L1 and L2 are length of active channels of the transistors TR1 and TR2, W1 and W2 are widths of active channels of the transistors TR1 and TR2, Nmax1 and Nmax2 are the maximum numbers of the "primary" crystal grain boundaries that can be contained in the active channel regions for each of the transistors TR1 and TR2, Gs1 and Gs2 are crystal grain sizes having a fatal effect on characteristics of each of the transistors TR1 and TR2, and $\theta$ is an angle in which the "primary" crystal grain boundaries are inclined at a direction perpendicular to an active channel direction of the respective transistors TR1 and TR2.

Furthermore, the present invention provides a polycrystalline silicon thin film of a TFT characterized in that probabilities containing the maximum number of respective primary crystal grain boundaries for transistors TR1 and TR2 that are arranged perpendicularly to each other are represented as a remaining distance ratio in which a distance occupied by the maximum number-1 crystal grains of the primary crystal grain boundaries is subtracted from a crystal grain size in a long axis direction of the active channel regions of a TFT substrate, and the probability P1 or P2 is not 0.5.

Furthermore, the present invention provides a device characterized in that an active matrix TFT using the polycrystalline silicon thin film fabricated by the present invention is used.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
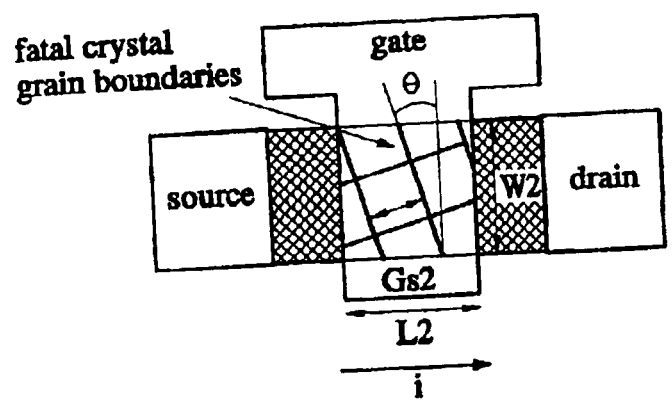
FIG. 1A is a cross-sectional view schematically illustrating a TFT in which the number of fatal crystal grain boundaries is 2 for an equal crystal grain size Gs and an active channel dimension L×W.
Figure 1A:
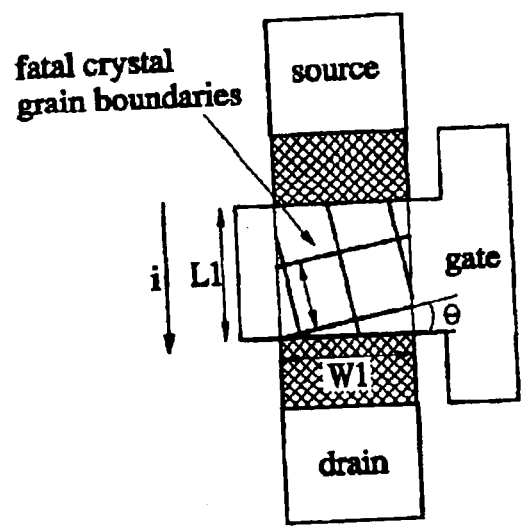
Figure 1B:
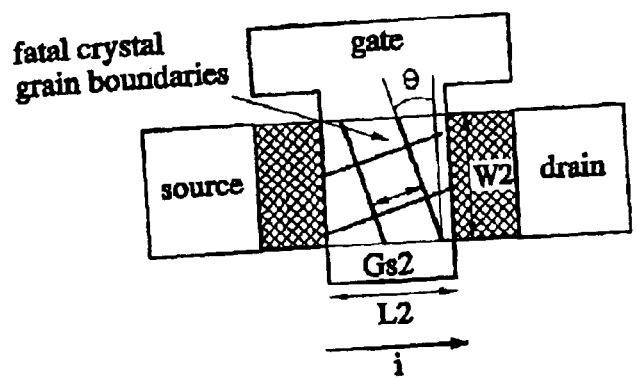
FIG. 1B is a cross-sectional view schematically illustrating a TFT in which the number of fatal crystal grain boundaries is 3.
Figure 1B:
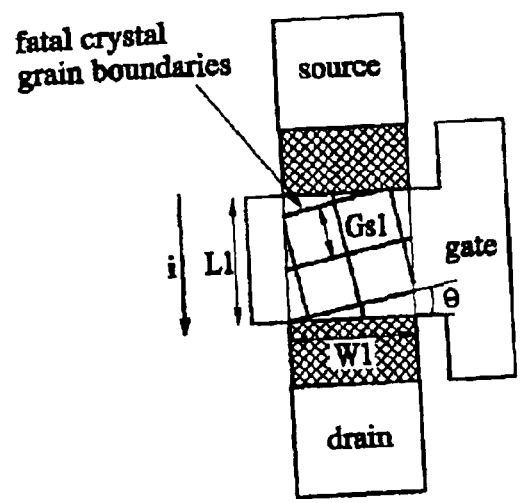
Figure 2A:
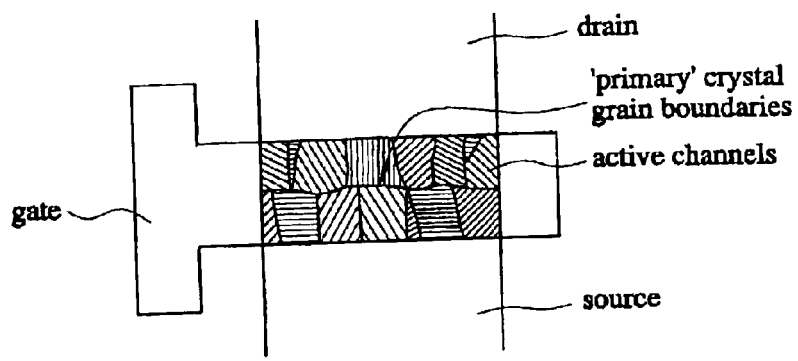
FIGS. 2A and 2B are cross-sectional views schematically illustrating active channels of a TFT comprising silicon grains having a large particle size formed by SLS crystallization according to conventional art.
Figure 2B:
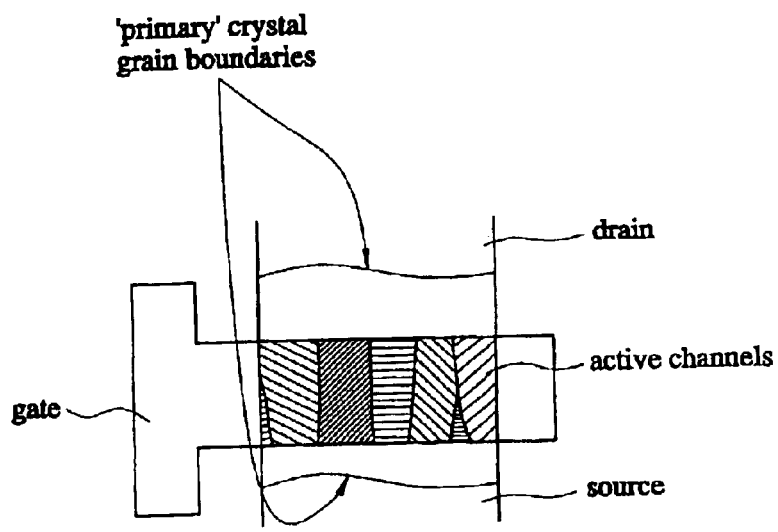
Figure 3A:
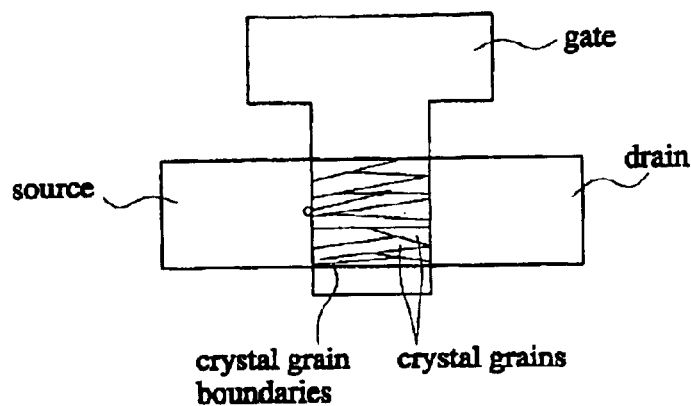
FIGS. 3A to 3C are other cross-sectional views schematically illustrating active channels of a TFT fabricated according to conventional art.
Figure 3B:
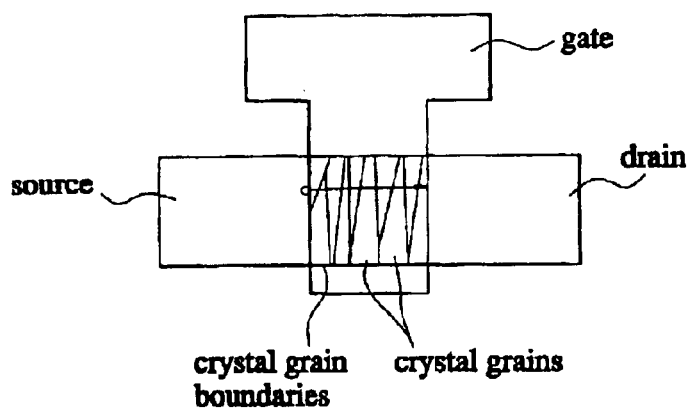
Figure 3C:
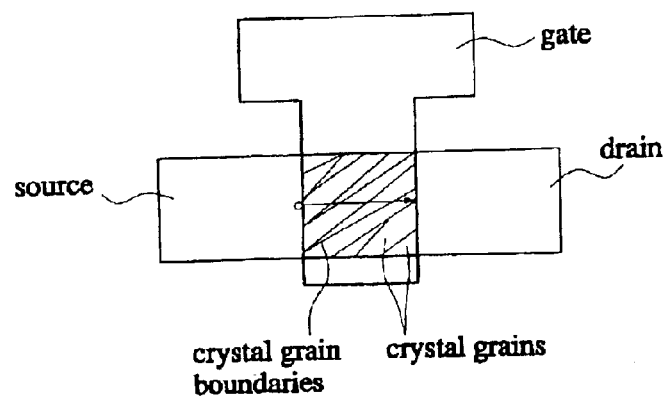

Reference will now be made in detail to the present preferred embodiments of the present invention, examples of which are illustrated in the accompanying drawings, wherein like reference numerals refer to like elements throughout.

A crystal grain boundary is formed between neighboring crystal grains due to a limited size of the crystal grains in the case where crystal grains of polycrystalline silicon, directly and indirectly exerting important influence on TFT characteristics, are enlarged and regularized when fabricating a TFT for an active matrix display.

"Crystal grain size" in the present invention refers to the distance between confirmable crystal grain boundaries, and is generally defined as a distance between the crystal grain boundaries belonging to the error range.

Particularly, a crystal grain boundary exerting a fatal influence on TFT characteristics results in inevitable defects due to the limit of processing accuracy during formation of a polycrystalline silicon thin film when the crystal grain boundary exists in an active channel region, namely, a "primary" crystal grain boundary in which an inclined angle of the crystal grain boundary to a direction perpendicular to an active channel direction is $-45° \leq \theta \leq 45°$.

TFTs which are always perpendicular to one another for circuit characteristics and space utilization are required not only in a pixel array, but also in a gate driving circuit or data driving circuit when fabricating an active matrix display using the TFTs.

Figure 4:
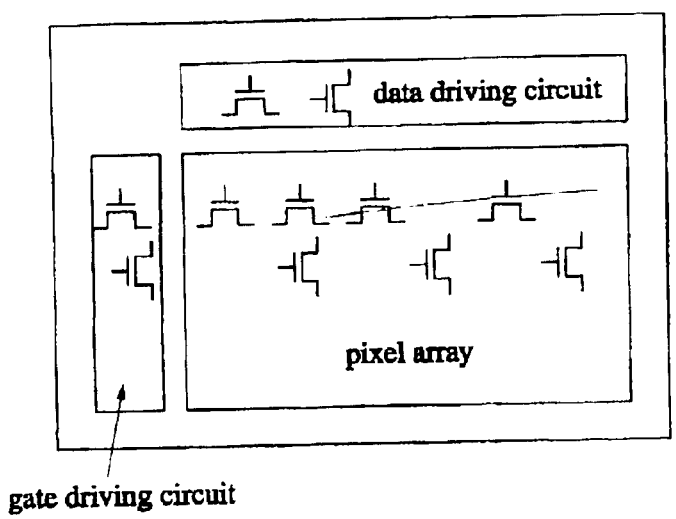
FIG. 4 is a schematic drawing illustrating an active matrix display comprising TFTs that are in a direction perpendicular to each other.

In FIG. 4, which is a schematic drawing illustrating an active matrix display comprising TFTs that are in a direction perpendicular to each other, crystal grains of polycrystalline silicon to improve characteristics having two directions perpendicular to each other should have a crystal growing direction parallel to the direction of respective TFTs. That is, characteristics of the TFTs are determined depending on the size and the direction of crystal grains in both directions perpendicular to one another.

The number of the "primary" crystal grain boundaries included in a TFT active channel region fabricated on a substrate or display region may be varied depending on the size and the direction of the crystal grains, and the dimension of the active channels, as illustrated in FIG. 4. Therefore, characteristics of a TFT and a display that are fabricated become non-uniform, or worse yet, the TFT and display may not even be driven at all.

In the present invention, the probability in which the maximum number of "primary" crystal grain boundaries exerting a fatal influence on a TFT substrate comprising TFTs perpendicular to each other, or characteristics of an active matrix display included in active channel regions has led to functions of the size and the direction of crystal grains, and the dimension of active channels so that a TFT having uniform characteristics can be fabricated on a substrate or display using the maximum number of the "primary" crystal grain boundaries.

Figure 5A:
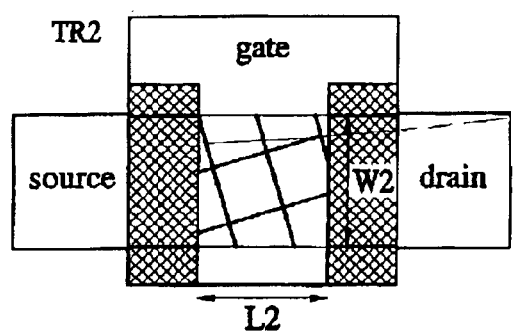
FIGS. 5A and 5B are drawings illustrating the structure of a TFT using polycrystalline silicon having crystal grain boundaries which are inclined at an angle of $\theta$ to a normal line for source/drain directions in active channel regions.
Figure 5A:
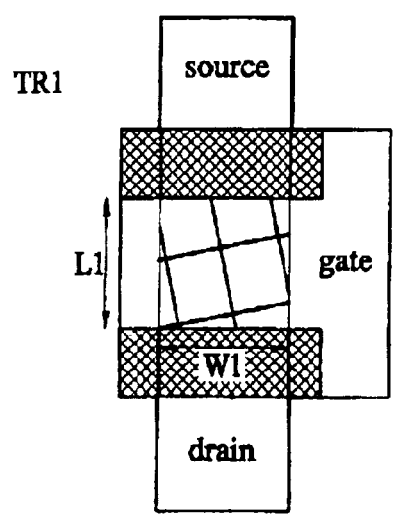
Figure 5B:
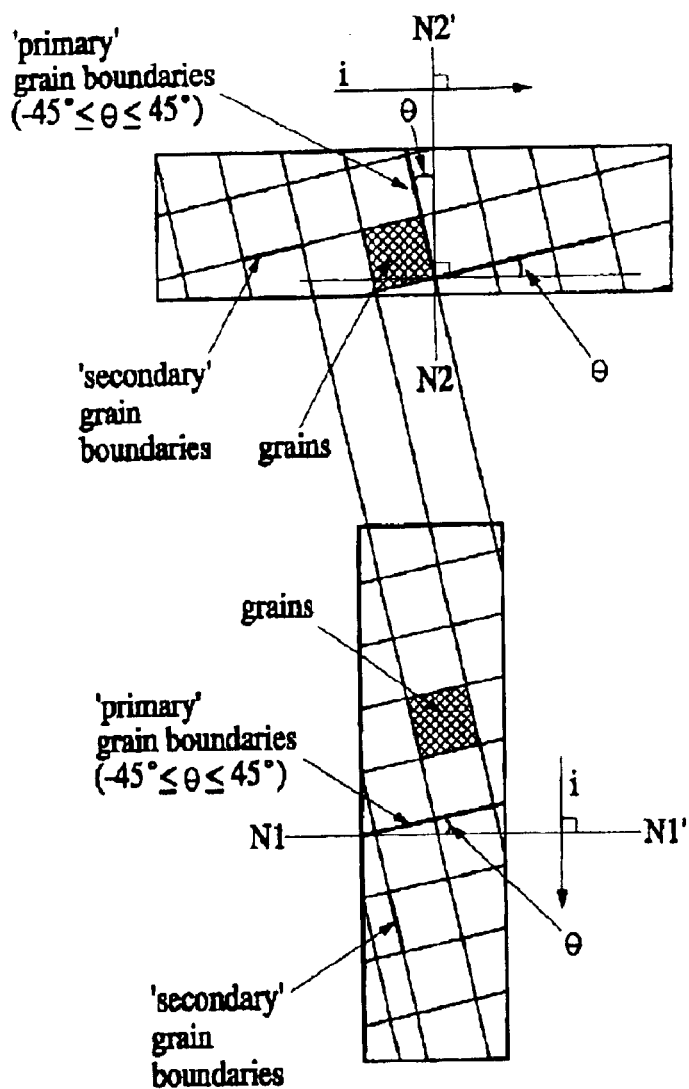

FIG. 5A and FIG. 5B are drawings illustrating the structure of a TFT using polycrystalline silicon having crystal grain boundaries which are inclined at an angle of θ to a normal line with respect to source/drain directions in active channel regions.

Referring to FIG. 5A and FIG. 5B, if a normal line to a source/drain direction is NN' in a type 1 transistor (TR1) and a type 2 transistor (TR2), a boundary between neighboring crystal grains of directions of the normal line NN' and crystal grain long axis is a "primary" crystal grain boundary, and an angle θ between the normal line NN' and the "primary" crystal grain boundary is $-45° \leq \theta \leq 45°$.

Figure 6A:
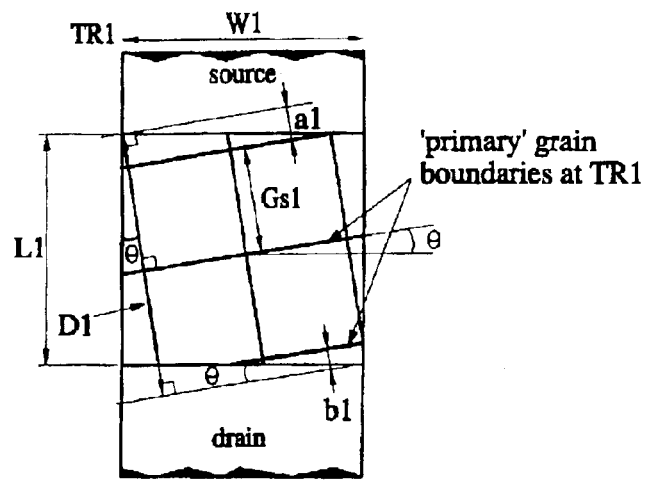
FIGS. 6A and 6B are drawings illustrated to calculate the probability in which the maximum number (FIG. 6A) or the maximum number-1 (FIG. 6B) "primary" crystal grain boundaries are included in active channel regions in the structure of a TFT using polycrystalline silicon having ordinary crystal grain boundaries that are not perpendicular to a source/drain direction in the active channel regions.
Figure 6B:
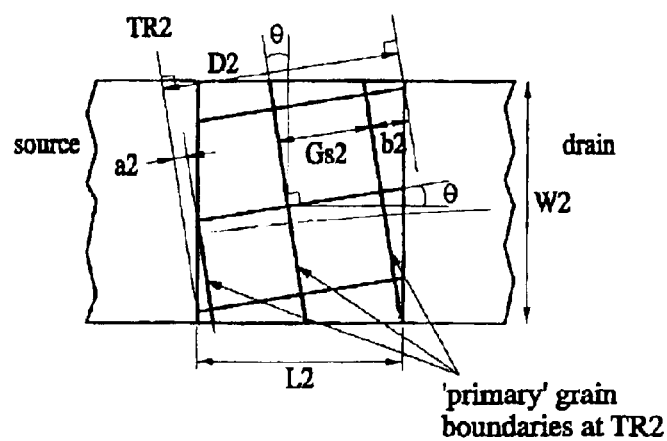

FIG. 6A and FIG. 6B are drawings illustrated to help calculate the probability in which the maximum number (FIG. 6A) or the maximum number−1 (FIG. 6B) "primary" crystal grain boundaries is included in active channel regions in the structure of a TFT using polycrystalline silicon having ordinary crystal grain boundaries that are not perpendicular to a source/drain direction in the active channel regions.

First of all, if a numerical expression for the type 1 transistor (TR1) is determined by referring to FIG. 6A, the maximum distance D between "primary" crystal grain boundaries in active channel regions having a length L1 and a width W1 can be represented as follows by a simple trigonometric function.

$$D1=(L1+x) \times \cos\theta$$

where $x = W1 \times \tan\theta$,

Therefore, $D1=(L1+W1 \times \tan\theta) \times \cos\theta = (L1 \times \cos\theta)+(W1 \times \tan\theta \times \cos\theta)$.

Since $(\tan\theta \times \cos\theta)$ is $\sin\theta$, D can be rewritten as $D1=(L1 \times \cos\theta)+(W1 \times \sin\theta)$. That is, D can be represented as functions of a length L1 and a width W1 of the active channel region, and an inclined angle θ of the "primary" crystal grain boundary for the normal line NN'.

If the size of crystal grains determining position of crystal grain boundaries exerting a fatal influence on characteristics of the type 1 TR1 is Gs1, and the maximum number of "primary" crystal grain boundaries included in active channel regions is Nmax1, Nmax1 can be obtained by the following numerical expression.

$$Nmax1 = \xi(D1/Gs1)$$

where function ξ can be defined as the following expression.

$$\xi(x) = \text{minimum integral number} \geq x,$$

where x is an arbitrary number.

That is, it can be seen that ξ is a function in which Nmax1=2 when x=2 while Nmax1=3 when x=2.3.

The probability P1 in which the maximum number Nmax1 of "primary" crystal grain boundaries is included in active channel regions can be represented as a ratio of (a1+b1) that is a distance obtained by subtracting a distance occupied by (Nmax1−1) crystal grains from the size of a crystal grain having a long axis direction Gs1 in FIG. 6A.

That is, $P1=(a1+b1)/Gs1$, and $a1+b1=D1-(Nmax1-1) \times Gs1$.

Therefore, P1 can be represented as in the following expression 1.

$$P1=(D1-(Nmax1-1) \times Gs1)/Gs1, \quad \text{Expression 1}$$

wherein if the probability in which the number of (Nmax1−1) "primary" crystal grain boundaries is included in active channel regions of the type 1 transistor (TR1) is Q1, a related expression P1+Q1=1 is formed from the definition of P1 and Q1.

Therefore, Q1 can be represented as in the following expression.

$$Q1=1-P1=1-\{(D1-(Nmax1-1) \times Gs1)/Gs1\}=(-D1+Nmax1)/Gs1$$

As in the type 1 transistor (TR1), the probability P2 in which the maximum number Nmax2 of "primary" crystal grain boundaries is included in active channel regions can be represented by $P2=(a2+b2)/Gs2$ as in the following expression 2 referring to FIG. 6B.

$$P2=(D2-(Nmax2-1) \times Gs2)/Gs2$$

where $D2=(L2 \times \cos\theta)+(W2 \times \sin\theta)$, $$Nmax2=\xi(D2/Gs2),\quad \text{Expression 2}$$

wherein if the probability in which the number of (Nmax2−1) "primary" crystal grain boundaries included in active channel regions of the type 2 TR2 is Q2, a related expression P2+Q2=1 is formed from the definition of P2 and Q2 referring to FIG. 6B.

Therefore, Q2 can be represented as the following expression.

$$Q2=1-P2=1-\{(D2-(Nmax2-1)\times Gs2)/Gs2\}=(-D2+Nmax2\times Gs2)/Gs2.$$

As described above, only the number of Nmax or (Nmax−1) "primary" crystal grain boundaries exists in each active channel region for two types of transistors perpendicular to each other, and the physical meaning of probabilities P1 and P2 can be reviewed as follows based on this idea.

In the case of P1 or P2=0

The probability in which the maximum number Nmax of "primary" crystal grain boundaries is included in active channel regions is 0. That is, only the number of Nmax−1 "primary" crystal grain boundaries can exist in the active channel regions. Therefore, extremely uniform TFT characteristics can be realized.

In the case of 0<P1 or P2<0.5

The probability in which the number of Nmax "primary" crystal grain boundaries can exist in active channel regions is lower than the probability in which the number of (Nmax−1) "primary" crystal grain boundaries can exist in the active channel regions.

In the case of P1 or P2=0.5

The probability in which the number of Nmax "primary" crystal grain boundaries is included in active channel regions is the same as the probability in which the number of (Nmax−1) "primary" crystal grain boundaries is included in the active channel regions. Therefore, extremely non-uniformed TFT characteristics can be shown.

In the case of 0.5<P1 or P2<1

The probability in which the number of Nmax "primary" crystal grain boundaries is included in active channel regions is higher than the probability in which the number of (Nmax−1) "primary" crystal grain boundaries is included in the active channel regions.

In the case of P1 or P2=1

The probability in which the maximum number Nmax of "primary" crystal grain boundaries is included in active channel regions is 1. That is, only the number of Nmax "primary" crystal grain boundaries can exist in the active channel regions. Therefore, extremely uniformed TFT characteristics can be realized.

In the case where the calculated combination is reflected on the polycrystalline silicon process and the TFT design after calculating the combination of size and direction of crystal grains and the dimension of active channels, in which probabilities P1 and P2 (including the maximum number of crystal grain boundaries for a type 1 transistor TR1 and a type 2 transistor TR2 perpendicular to each other) become 1 or 0 at the same time from the meaning of the probabilities P1 and P , the following occurs. The present invention not only secures uniformity of the whole TFT substrate or characteristics of the TFT fabricated in selected regions, but also controls the process margin capable of securing uniformity of the TFT even when forming active channels by etching of gate metal during the TFT fabrication process.

Numerical Expression in the case of θ=0°

Figure 7A:
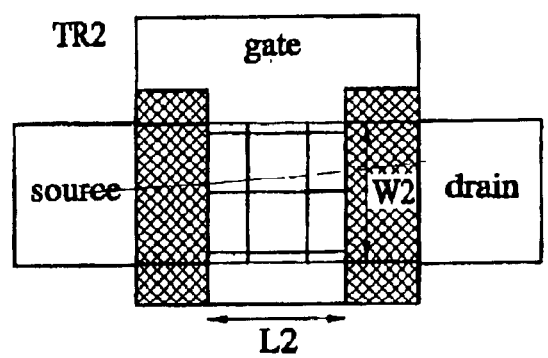
FIGS. 7A and 7B are drawings schematically illustrating the structure of a TFT using polycrystalline silicon having crystal grain boundaries that are perpendicular to a source/drain direction in the active channel regions in the case of $\theta=0°$.
Figure 7A:
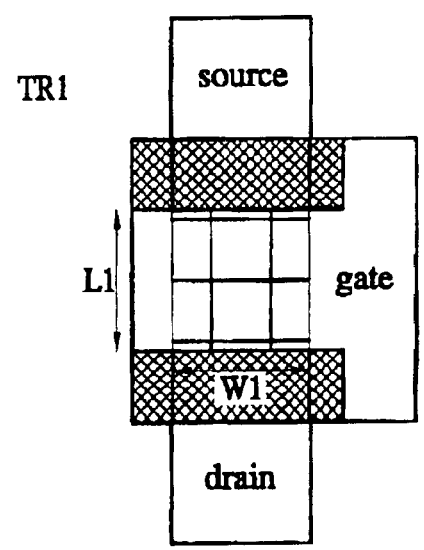
Figure 7B:
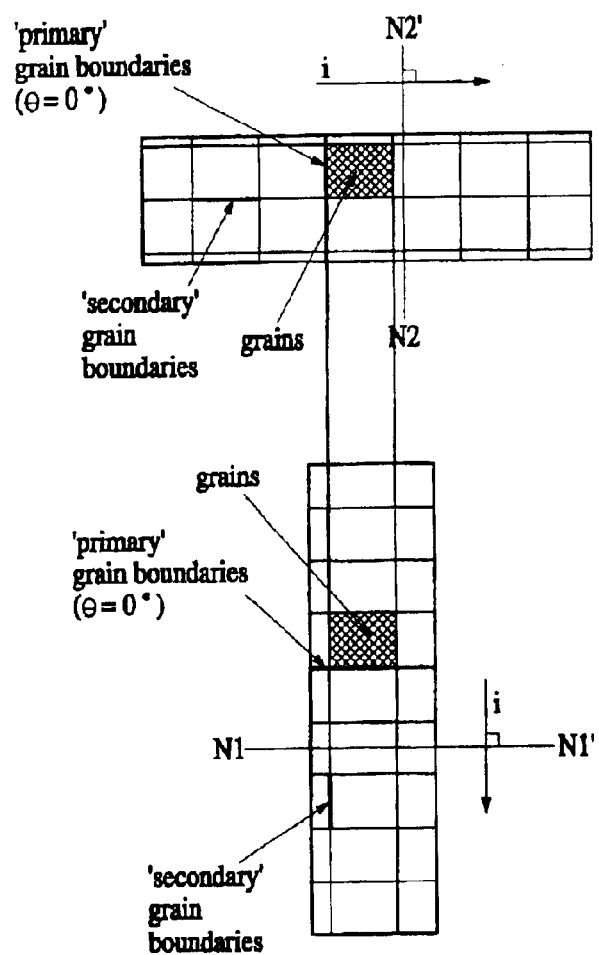

FIG. 7A and FIG. 7B are drawings schematically illustrating the structure of a TFT using polycrystalline silicon having crystal grain boundaries that are perpendicular to a source/drain direction in the active channel regions in the case where θ=0°.

Referring to FIG. 7A and FIG. 7B, in which "primary" crystal grain boundaries are inclined at an angle of θ to a normal line NN' to the source/drain direction, there can be a special case of θ=0°. If the equal number of "primary" crystal grain boundaries is included in active channel regions, it is expected that influence exerted on TFT characteristics by "secondary" crystal grain boundaries perpendicular to the "primary" crystal grain boundaries is decreased, and the TFT characteristics accordingly become more superior in the case where θ=0° compared to the case where θ≠0°.

Figure 8A:
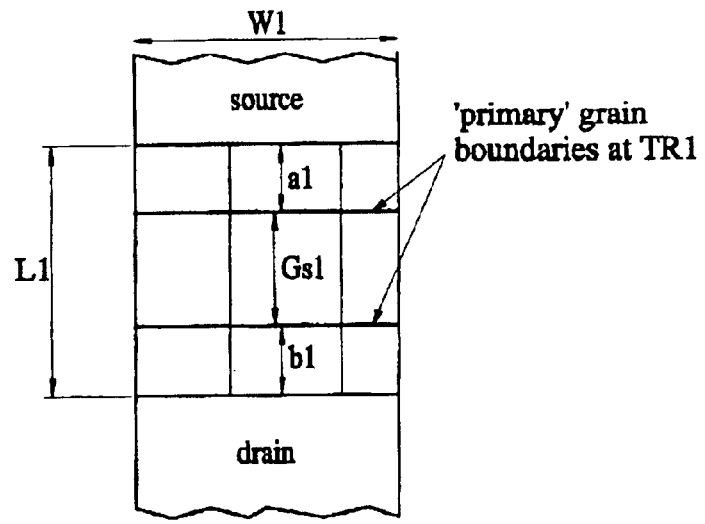
FIGS. 8A and 8B are drawings illustrated to calculate probability in which the maximum number (FIG. 8A) or the maximum number-1 (FIG. 8B) "primary" crystal grain boundaries are included in active channel regions in the structure of a TFT using polycrystalline silicon having crystal grain boundaries that are perpendicular to a source/drain direction in the active channel regions in the case of $\theta=0°$.
Figure 8B:
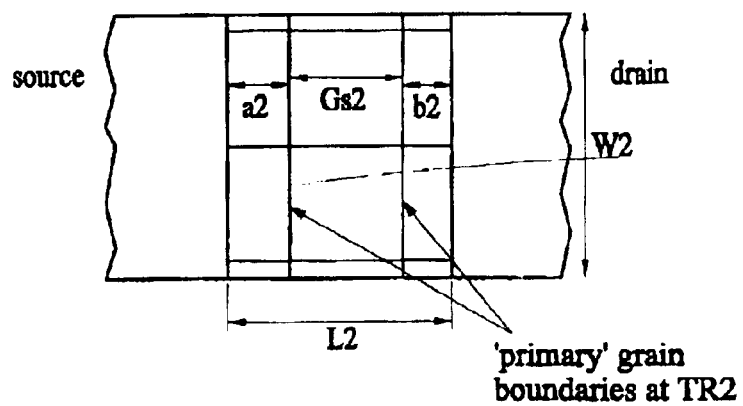

FIG. 8A and FIG. 8B are drawings illustrated to calculate the probability in which the maximum number (FIG. 8A) or the maximum number−1 (FIG. 8B) "primary" crystal grain boundaries are included in active channel regions in the structure of a TFT using polycrystalline silicon having crystal grain boundaries that are perpendicular to a source/drain direction in the active channel regions in the case of θ=0°.

In FIG. 8A and FIG. 8B, D1 =L1, and D2=L2 respectively for a type 1 transistor (TR1) and a type 2 transistor (TR2) by Expressions 1 and 2, wherein the Expressions 1 and 2 are no longer functions of W and θ.

Therefore, probabilities P1 and P2 can be represented as follows.

$$P1=(L1-(Nmax1-1)\times Gs1)/Gs1,\text{ and }P2=(L2-(Nmax2-1)\times Gs2)/Gs2,$$

wherein as the probability including the number of (Nmax−1) "primary" crystal grain boundaries in active channel regions is P+Q=1, Q1 and Q2 can be represented as follows.

$$Q1=(-D1+Nmax1\times Gs1)/Gs1,\text{ and }Q2=(-D2+Nmax2\times Gs2)/Gs2.$$

Figure 9A:
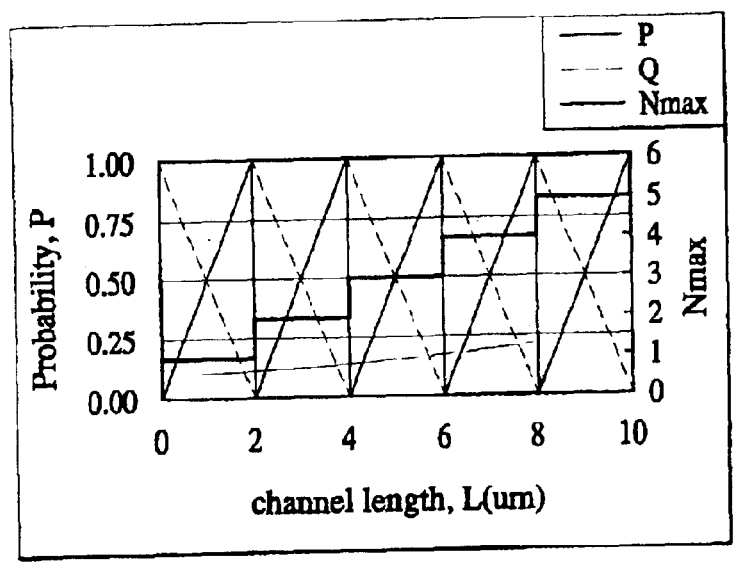
FIGS. 9A and 9B are graphs illustrating an example of calculating the process margin of a TFT substrate that can be fabricated according to an embodiment of the present invention.
Figure 9B:
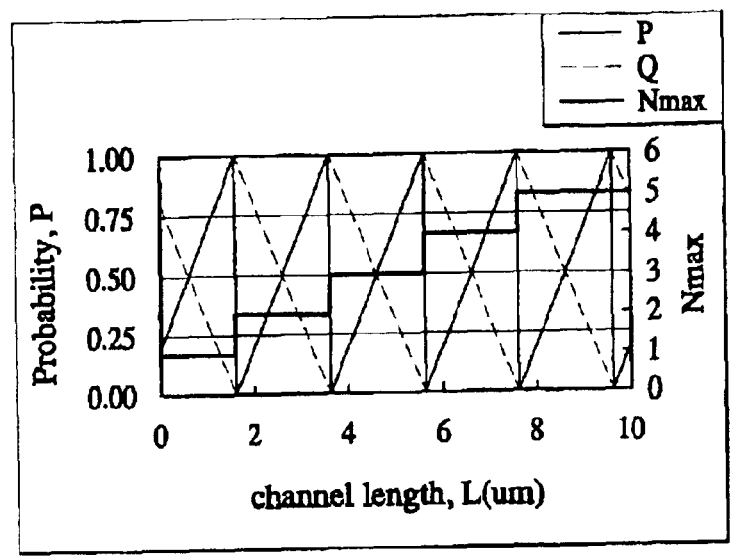

FIG. 9A and FIG. 9B are graphs illustrating examples to aid in calculating the process margin of a TFT substrate that can be fabricated according to an embodiment of the present invention.

Referring to FIG. 9A and FIG. 9B, it can be seen that the probability P1 or P2 becomes 1 in an active channel length having an integral number multiple of the crystal grain size (FIG. 9A), or in an active channel length having a value of 1.6 μm+an integral number multiple of the crystal grain size (FIG. 9B), when illustrating probabilities including the maximum number of crystal grain boundaries according to the length of active channels in active channel regions according to Expression 1 of the present invention. This occurs in the case where the size of the crystal grains is 2 μm, and crystal grain boundaries are perpendicular to a source/drain direction (FIG. 9A), or in case where the size of crystal grains is 2 μm, and the crystal grain boundaries are inclined with respect to the source/drain direction at a certain angle (θ=2°, FIG. 9B).

That is, non-uniformity of TFT characteristics according to misalignment or displacement of a TFT generated during fabrication of a substrate can be completely removed when designing a TFT using a channel length in which the probability P1 or P2 becomes 1.

However, the variability of length of the active channels according to etching always exists in the gate forming process determining the length of active channels during TFT designing and length of active channels in the actual TFT fabrication process, and the process margin for securing the probability P1 or P2 according to the variability of length of the active channels can be calculated.

Referring to FIG. 9A, it can be seen that a channel length, in which P1 or P2≧0.75, should be within 0.5 μm in the case of θ=0°, and should be within 0.4 μm in the case of θ=2° when P1 or P2=1.

As described above, the present invention improves the whole TFT substrate comprising two or more transistors perpendicular to each other or characteristics of the transistors in selected regions. Furthermore, the present invention not only designs a TFT capable of securing optimum uniformity, but also predicts and thus controls the process margin required during fabrication of the TFT substrate in advance to secure desired uniformity since uniformity of respective transistors is determined by size and direction of polycrystalline silicon crystal grains parallel to the direction of the respective transistors.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A polycrystalline silicon thin film of a TFT in which probabilities P1 and P2 for which the maximum number of respective primary crystal grain boundaries for transistors TR1 and TR2 arranged perpendicular to each other are contained in active channel regions are represented as in the following:

$$P1=(D1-(Nmax1-1)X*Gs1)/Gs1;$$

$$P2=(D2-(Nmax2-1)X*Gs2)/Gs2;$$

where P1 or P2 is not 0.5, D1=L1 cos θ+W1 sin θ, D2=L2 cos θ+W2 sin θ, L1 and L2 are lengths of active channels of the transistors TR1 and TR2, W1 and W2 are widths of active channels of the transistors TR1 and TR2, Nmax1 and Nmax2 are the maximum numbers of the primary crystal grain boundaries that are contained in the active channel regions for each of the transistors TR1 and TR2, Gs1 and Gs2 are crystal grain sizes having a fatal effect on characteristics of each of the transistors TR1 and TR2, and θ is an angle in which the primary crystal grain boundaries are inclined at a direction perpendicular to an active channel direction of the respective transistors TR1 and TR2.

2. The polycrystalline silicon thin film of a TFT of claim 1, wherein the polycrystalline silicon thin film is arranged on the whole substrate of a display device.

3. The polycrystalline silicon thin film of a TFT of claim 1, wherein the probability P1 or P2 is 0.75 or more, or 0.25 or less.

4. The polycrystalline silicon thin film of a TFT of claim 1, wherein the angle θ satisfies −45°≦θ≦45°.

5. The polycrystalline silicon thin film of a TFT of claim 4, wherein the angle θ is 0°.

6. A polycrystalline silicon thin film of a TFT in which probabilities P1 and P2 containing the maximum number of respective primary crystal grain boundaries for transistors TR1 and TR2 that are arranged perpendicularly to each other are represented as a remaining distance ratio in which a distance occupied by the maximum number minus 1 crystal grains of the primary crystal grain boundaries is subtracted from a crystal grain size in a long axis direction of the active channel regions of a TFT substrate, and the probability P1 or P2 is not 0.5.

7. The polycrystalline silicon thin film of a TFT of claim 6, wherein the polycrystalline silicon thin film is arranged on the whole substrate of a display device.

8. The polycrystalline silicon thin film of a TFT of claim 6, wherein the P1 or P2 is 0.75 or more, or 0.25 or less.

9. A device in which an active matrix TFT using the polycrystalline silicon thin film of claim 1 is used.

10. The device of claim 9, wherein the device is used as a display device or a semiconductor device.

11. The device of claim 10, wherein the display device is a liquid crystal display device or an organic electroluminescent device.

12. A device in which an active matrix TFT using the polycrystalline silicon thin film of claim 6 is used.

13. The polycrystalline silicon thin film of a TFT of claim 1, wherein Nmax1 is obtained by the following:

$$Nmax1=\xi(D1/Gs1),$$

where function $\xi$ can be defined by the following:

$\xi(x)$=minimum integral number≧x, where x is an arbitrary number.

14. The polycrystalline silicon thin film of a TFT of claim 1, wherein if the probability in which the number of (Nmax1−1) primary crystal grain boundaries included in active channel regions of the type 1 transistor (TR1) is Q1, then P1+Q1=1.

15. The polycrystalline silicon thin film of a TFT of claim 1, wherein Nmax2 is obtained by the following:

$$Nmax2=\xi(D2/Gs2),$$

where function $\xi$ can be defined by the following:

$\xi(x)$=minimum integral number≧x, where x is an arbitrary number.

16. The polycrystalline silicon thin film of a TFT of claim 1, wherein if the probability in which the number of (Nmax2−1) primary crystal grain boundaries included in active channel regions of the type 2 transistor (TR2) is Q2, then P2+Q2=1.

* * * * *

UNITED STATES PATENT AND TRADEMARK OFFICE
CERTIFICATE OF CORRECTION

PATENT NO.     : 6,825,494 B2  
DATED          : November 30, 2004  
INVENTOR(S)    : Ki Yong Lee et al.

It is certified that error appears in the above-identified patent and that said Letters Patent is hereby corrected as shown below:

Title page,
Item [57], ABSTRACT,
Line 7, second instance of "," should be -- + --.

Column 9,
Line 31, equation should read -- $P1=(D1(Nmax1-1)Gs1)/Gs1$ --.
Line 31, equation should read -- $P2=(D2(Nmax2-1)Gs2)/Gs2$ --.

Signed and Sealed this

Seventh Day of June, 2005

JON W. DUDAS  
*Director of the United States Patent and Trademark Office*